United States Patent [19]
Do et al.

[11] Patent Number: 5,859,526
[45] Date of Patent: Jan. 12, 1999

[54] VOLTAGE REFERENCE GENERATOR FOR QUICKLY CHARGING CAPACITIVE LOADS

[75] Inventors: Tien-Dung Do, Impasse des Mésanges; Mathieu Lisart, rue Manuel, both of France

[73] Assignee: SGS-Thomson Microelectronics S.A., Saint Genis, France

[21] Appl. No.: 871,096

[22] Filed: Jun. 6, 1997

[30] Foreign Application Priority Data

Jun. 20, 1996 [FR] France ................................. 96 07706

[51] Int. Cl.⁶ ...................................................... G05F 1/40
[52] U.S. Cl. ........................ 323/280; 323/314; 323/281; 330/279
[58] Field of Search ..................................... 323/313, 314, 323/280, 281; 327/563, 539, 541; 330/279, 282, 293

[56] References Cited

U.S. PATENT DOCUMENTS

| | | |
|---|---|---|
| 4,185,251 | 1/1980 | Brown, Jr. et al. ..................... 330/110 |
| 4,260,946 | 4/1981 | Wheatley, Jr. ........................... 323/314 |
| 4,677,369 | 6/1987 | Bowers et al. ........................... 323/314 |
| 5,086,238 | 2/1992 | Watanabe et al. ....................... 323/314 |
| 5,146,152 | 9/1992 | Jin et al. .................................. 323/280 |

*Primary Examiner*—Shawn Riley
*Attorney, Agent, or Firm*—Wolf, Greenfield & Sacks, P.C.

[57] ABSTRACT

A voltage reference generator includes a voltage source and a differential amplifier. The voltage source supplies a stable voltage reference to a positive input of the differential amplifier which is configured as a follower having its output looped back to its negative input. The negative feedback loop is a variable-resistance loop that is controlled by the output of the differential amplifier. The variable-resistance feedback loop transiently imposes open-loop operation when the voltage reference generator is turned on so as to provide high current to the output before imposing closed-loop operation in follower mode.

36 Claims, 3 Drawing Sheets

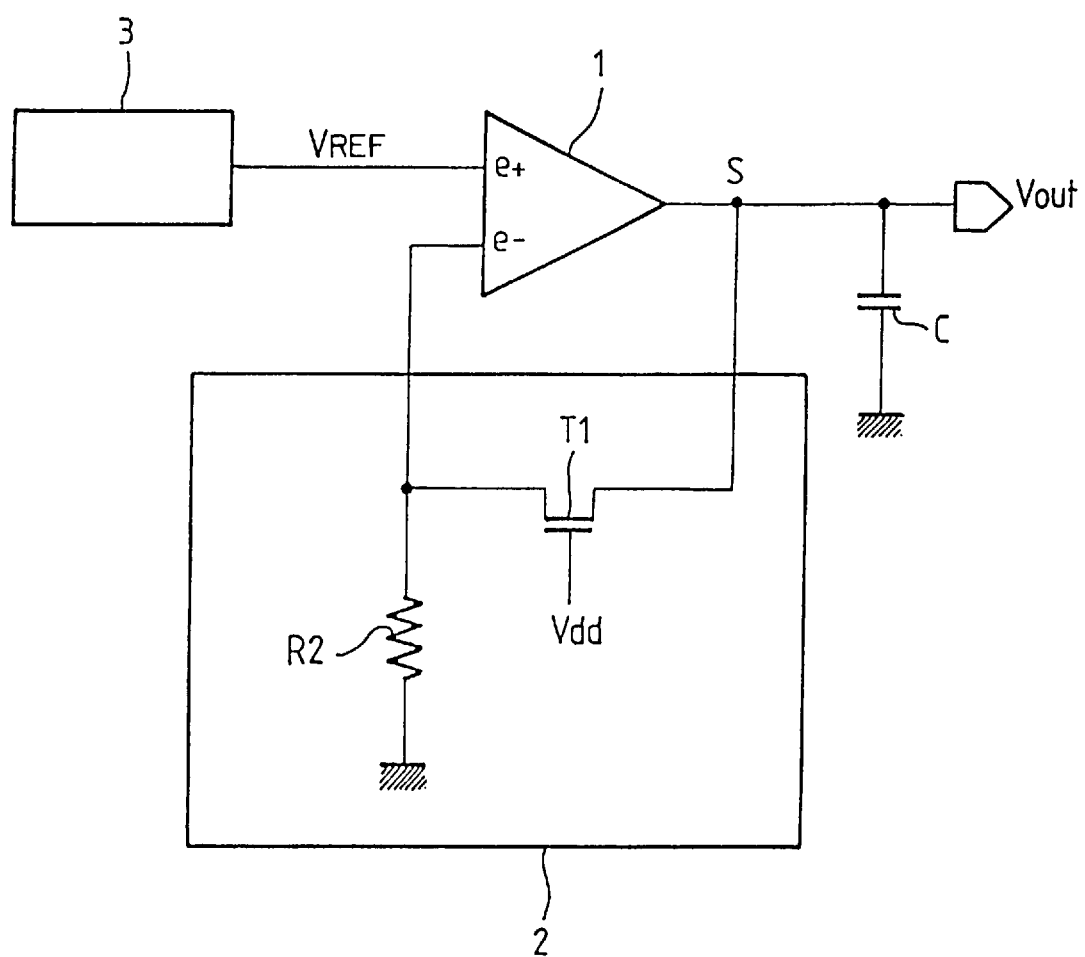

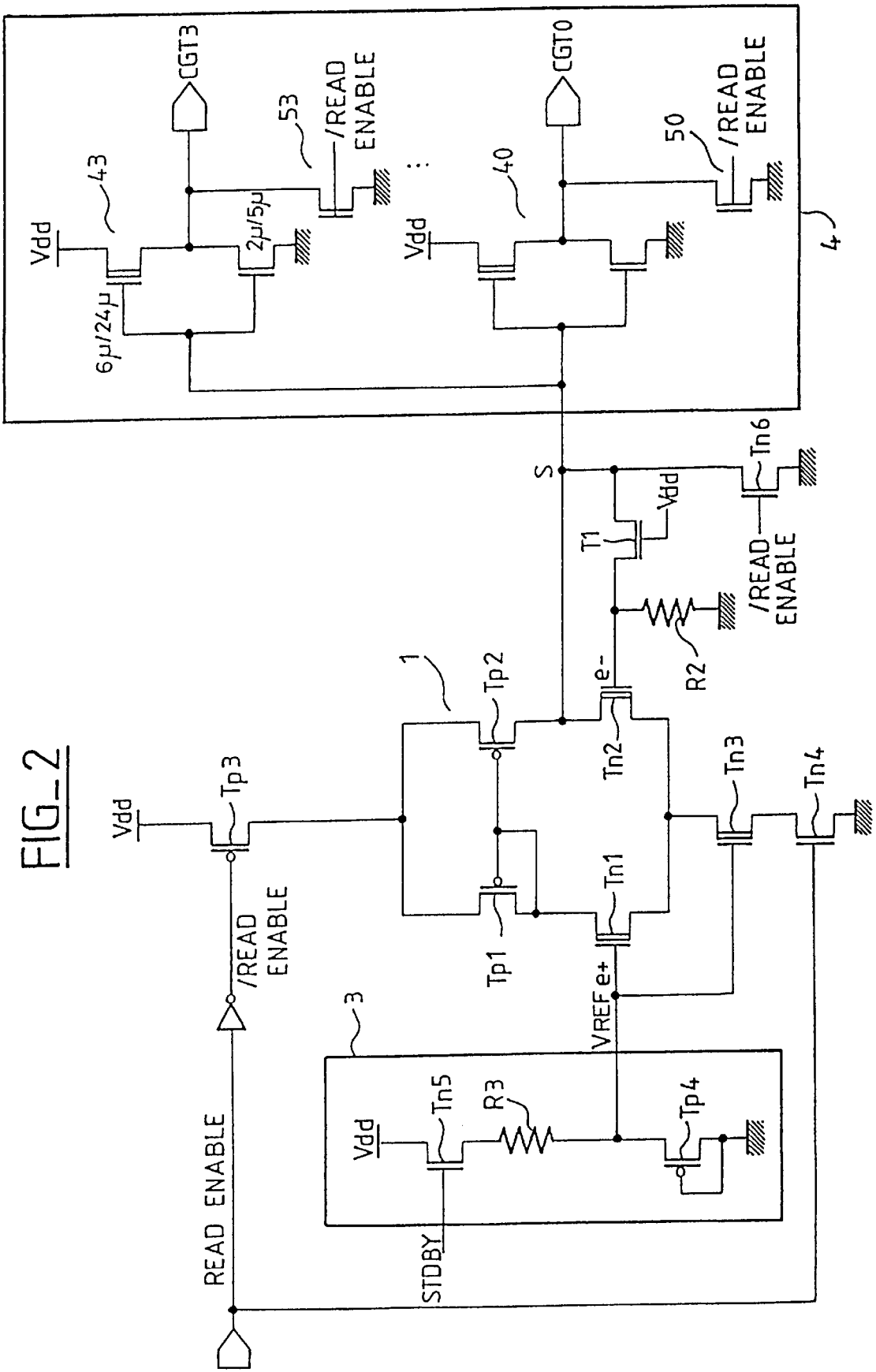
FIG_2

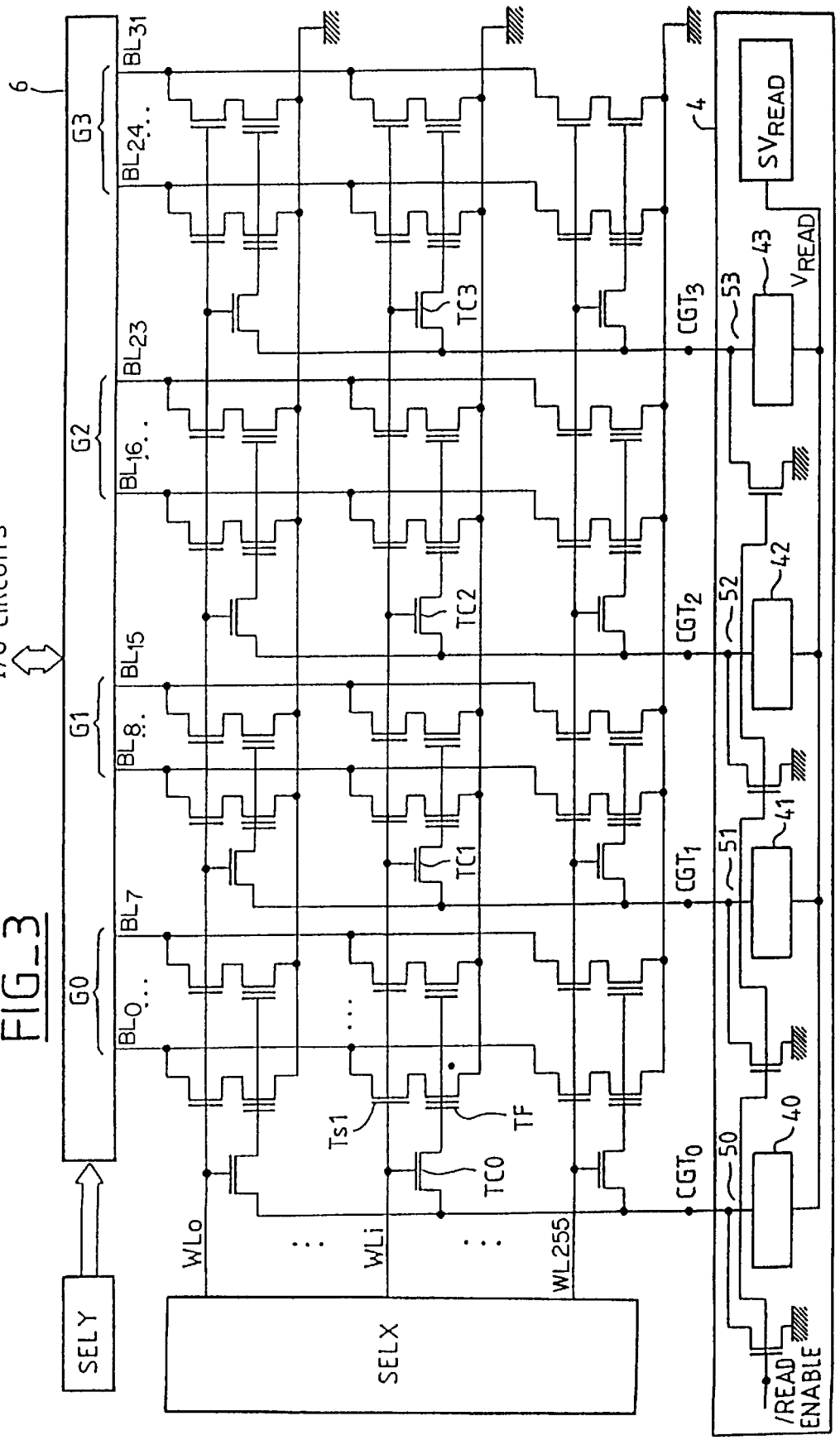

VOLTAGE REFERENCE GENERATOR FOR QUICKLY CHARGING CAPACITIVE LOADS

BACKGROUND OF THE INVENTION

1. Field of the Invention

The present invention relates to a voltage reference generator, and more particularly to a voltage reference generator that generates a read voltage reference applicable to the cells of an EEPROM memory.

2. Discussion of the Related Art

The read voltage applied to the cells of a memory circuit is usually produced from the logic supply voltage of the circuit. It typically has a level below this supply voltage, for example, on the order of 2.5 volts. This read voltage should be stable to enable reliable reading of the memory cells, meaning that it should not vary with the supply voltage or the temperature. It should also be reproducible from one circuit to another despite the fact that the characteristics, for example the threshold voltage of the transistors, may vary dependent on the particular manufacturing method used.

The circuits used to generate a voltage reference of this kind generally use a current mirror structure with means to compensate for the different variations of temperature, supply voltage, etc. An example of such a structure is given for example in the French patent application No. FR 95 09023. Other circuits use a differential amplifier mounted as a follower amplifier to deliver, at the output, the reference voltage given by a voltage source at its positive input.

Usually, the read voltage reference generation circuit associated with a memory in an integrated circuit works continuously, once the integrated circuit is no longer in standby mode. However, it is a design goal to limit the consumption of the integrated circuits.

One way of limiting the consumption in an integrated circuit of this kind is to activate the read reference circuit only when it is needed, namely on demand, when there actually is a read operation to be carried out. However, using conventional read reference circuits, a problem arises. Because the read voltage reference is applied to a highly capacitive line, the build-up time of this read voltage is very long. This problem is further aggravated when these circuits are based on current mirror structures which require a long time to reach the state of equilibrium. Accordingly, conventional voltage reference circuits cannot be used on demand.

SUMMARY OF THE INVENTION

An object of the present invention is to resolve the afore-mentioned technical problems. It is a further object of the present invention to obtain a circuit for the generation, on demand, of a stable reference voltage that is lower than the logic supply voltage, in particular, to charge a capacitive line.

A solution to the afore-mentioned technical problems is found in an embodiment of the present invention that includes a structure using a voltage source to apply a reference voltage to the positive input of a differential amplifier mounted as a follower with its output looped back to its negative input. According to an embodiment of the present invention, the negative feedback loop is a variable-resistance loop controlled by the output of the amplifier in order to impose, transiently, an open loop operation when the voltage is turned on in such a way as to give high current at the output before imposing a closed-loop operation in follower mode.

According to an embodiment of the present invention, the reference voltage source does not have to source a large amount of current, rather, it simply should be stable. It is the amplifier that provides the high current necessary to quickly charge the capacitive line when the voltage is turned on, through its very high gain when the negative feedback loop is open. As soon as the capacitive line is sufficiently charged, the voltage level at the output becomes high, bringing the gain of the amplifier to unity (closed loop—follower assembly). The reference voltage level is then seen again at the output. Thus, instead of the two microseconds that would be necessary with a conventional voltage reference circuit, only 200 nanoseconds are necessary to obtain the level of the reference voltage at the output. Furthermore, the generator, according to the embodiments of the present invention, is quite stable.

BRIEF DESCRIPTION OF THE DRAWINGS

Other advantages and characteristics of a preferred, non-limiting embodiment of the present invention are described by way of example with reference to the accompanying drawings, in which:

FIG. 1 shows a block diagram of a circuit for generating a reference voltage according to an embodiment of the present invention;

FIG. 2 shows a more detailed diagram of this circuit; and

FIG. 3 shows a block diagram of an $E^2PROM$ memory to which a circuit according to an embodiment of the present invention can be applied.

DETAILED DESCRIPTION

FIG. 1 shows a circuit for generating a reference voltage Vout according to an embodiment of the present invention. It includes a differential amplifier 1 and a loop circuit 2 for the looping of the output S of this amplifier to its negative (inverting) input e−.

The positive input e+ of the differential amplifier 1 receives a reference voltage VREF provided by a reference voltage source 3. The voltage source 3 does not have to supply significant loads, rather, it only needs to be capable of providing a stable reference. The voltage source 3 can be based, for example, on a P type diode-mounted transistor.

The loop circuit 2 includes a transistor Ti that is series-connected between the output S and the negative input e− of the amplifier. In the example, Transistor T1 is an N type transistor and its gate is biased by the logic supply voltage Vdd. The loop circuit 2 also includes a resistor R2 that is connected between the negative input e− and ground. FIG. 1 also shows a capacitor C representing the load at output of the generator.

The operation of the voltage reference generator depicted in FIG. 1 is as follows. Transistor T1 is equivalent to a variable resistor R1 that is controlled by the output S of the amplifier. The gain β of the amplifier is given by:

$$\beta = (R1 = R2)/R2$$

When the reference voltage VREF is turned on, the output S is at zero volts. The transistor T1 is therefore not conductive and its equivalent resistance R1 is infinite. In practice, the gain of the amplifier is then very great (open loop operation). The amplifier therefore provides a very strong current that enables a very swift charging of the capacitor C. The output voltage Vout then increases and the transistor T1 becomes conductive. The equivalent resistance R1 becomes almost zero and the gain of the amplifier then tends gradually towards unity (closed loop-follower assembly operation). The reference voltage VREF is then seen again at output (Vout=VREF).

A more detailed drawing of a voltage reference generation circuit is given in FIG. 2. In the example of FIG. 2, the differential amplifier 1 is depicted as a CMOS assembly. It thus has a first P type transistor Tp1 and a second P type transistor Tp2 mounted as a current mirror. The transistor Tp1 has its gate connected to its drain and the gates of the two transistors Tp1 and Tp2 are connected together. The assembly also has a first N type transistor Tn1 and a second N type transistor Tn2. The transistors Tp1 and Tn1 are series-connected between the logic supply voltage Vdd and ground, and the transistors Tp2 and Tn2 are also series-connected between the logic supply voltage Vdd and ground. The gate of the first N type transistor Tn1 is the positive input of the differential amplifier and the gate of the second N type transistor Tn2 is the negative input of the differential amplifier. The output S of the differential amplifier is given by the common connection point of the transistors Tp2 and Tn2. The differential amplifier also has a third N type transistor Tn3 that is used as a current generator. The drain of this transistor Tn3 is connected in common to the sources of the transistors Tn1 and Tn2.

To control the differential amplifier on demand, two switching transistors Tp3 and Tn4 are provided. A first switching transistor, which is a P type transistor referenced Tp3, enables the switching over of the supply voltage Vdd to the sources of the transistors Tp1 and Tp2. Transistor Tp3 is controlled at its gate by the inverse of an enabling signal. This inverse signal is referenced /READ ENABLE.

A second N type switching transistor referenced Tn4 enables the connection of the source of the transistor Tn3 to ground. It is controlled at its gate by the enabling signal READ ENABLE. When this enabling signal is activated (READ ENABLE=1), the two switching transistors Tp3 and Tn4 are equivalent to short circuits and the differential amplifier is supplied by the logic supply voltage Vdd and ground. When this enabling signal is deactivated, the differential amplifier is no longer so supplied.

The positive input e+ of the differential amplifier receives the output VREF from a stable voltage source 3. In the example of FIG. 2, this voltage source 3 has a P type transistor Tp4 having its gate connected to its drain, biased by a resistor R3. Transistor Tp4 is supplied by the logic supply voltage Vdd when a switching transistor Tn5 is active. The transistor Tn5 is controlled by the standby signal STDBY of the circuit. When this signal is inactive, (STDBY=0) the transistor Tn5 is off and the circuit 3 is not supplied.

The resistor R3 is sized so that the output voltage VREF taken between the resistor R3 and the transistor Tp4 is stable with a voltage in the range of the threshold voltage of the transistor P. Thus in practice there is a voltage VREF of the order of 2.5 volts. This stable voltage VREF is applied to the positive input e+ of the differential amplifier. In the example, it is also used as a bias voltage of the transistor Tn3 (current source). Finally, an N type transistor Tn6 is provided and is connected between the output S of the differential amplifier and ground. Transistor Tn6 is controlled at its gate by the inverse signal /READ ENABLE for the enabling of the reference generation circuit. Transistor Tn6 sets the output S of the amplifier at zero so long as the generation circuit is not activated (READ ENABLE=0).

When the generator is activated (STDBY=1, READ ENABLE=1), the output S of the differential amplifier is initially at zero. The transistor T1 is therefore not conductive since its drain is at zero. The gate of the transistor Tn2 of the output arm of the differential amplifier is then at zero, and therefore, transistor Tn2 is off. Thus, all the current conducted by the transistor Tp2 of this arm is used to charge the output. No current is consumed by the transistor Tn2. When the generator is turned on, there is therefore a high current at the output that enables fast charging of a capacitive line (not shown). The output voltage S will therefore increase rapidly. As soon as the output voltage is fairly high, transistor T1 will become conductive, thus making the transistor Tn2 of the amplifier also conductive. The normal operation of the amplifier, in closed loop, is then recovered with a gain equal to unity. The level of the reference voltage VREF applied to the input e+ is then seen again at the output S.

In practice, it has been measured that the build-up time of the voltage Vout at output S of the amplifier is on the order of 200 nanoseconds once the READ ENABLE signal is activated. In contrast, with conventional voltage reference generator circuits, at least one microsecond is needed. Furthermore, the generator according to this embodiment of the invention gives a stable output voltage Vout. Indeed, if the temperature increases, the threshold voltage of the transistors tends to decrease. Hence, the reference voltage VREF tends to decrease. But since the threshold voltages of the N type and P type transistors of the amplifier also tend to decrease, the amplifier will compensate for the variation of the input voltage VREF. In a similar manner, variations of the threshold voltages of the transistors due to the manufacturing method are also compensated for by the amplifier.

The generator according to an embodiment of the present invention enables a reduction of the consumption of an integrated circuit, by consuming only when it is used. In point of fact, the voltage circuit 3 consumes continuously once the circuit is no longer in standby mode (STDBY=1), but the consumption of this circuit 3 is negligible.

Various improvements to the previously described embodiment of the present invention are shown in FIGS. 2 and 3. These improvements are aimed more particularly at the use of a reference generator to provide the read voltage to the cells of a memory.

If the memory capacity of a memory is high (namely with a large number of memory cells), it may be preferable to use a set 4 of output buffers (registers) 40 to 43 so that each one delivers the reference voltage Vout at the output of the reference generator to a group of cells (CGT0 to CGT3). This set then makes it possible to reduce the capacitance as seen from the output of the differential amplifier 1 of the generator. Each output buffer will then be such that the top transistor (connected to the supply voltage) is wide to give high current with the bottom transistor providing for the bias. In the example shown in FIG. 2, the top transistor is a native transistor and the bottom transistor is an enhanced transistor, both being N type transistors.

The output of each output buffer is applied to the associated group of cells. In the example, a respective transistor (50 to 53) is provided for each output buffer and controlled by the /READ ENABLE command to pull the lines CGT0 to CGT3 to the ground when the reading is not active. A set 4 of buffers of this kind is particularly useful for the application of the read voltage to a highly capacitive line, for it reduces the capacitance seen from the output of the generator.

An exemplary application to an $E^2$PROM memory is shown in FIG. 3. It is recalled that, for these memories, a memory cell comprises a floating gate transistor TF and a selection transistor. This selection transistor is controlled at its gate by a signal for the selection of a word line (WLi) and connects a bit line BLO to the drain of the floating-gate transistor. Associated with a word line, another selection transistor Tsi is controlled at its gate by the word line selection signal (WLi) to switch an operational voltage, namely a reading, programming or erasure voltage, over to the gate.

In the recent structures of E²PROM memories, there is provision for dividing the memory into groups of bit lines. In the example shown, the memory comprises four groups: G0 (BL0 to BL7), G1 (BL8 to BL15), G2 (BL16 to BL23) and G3 (BL24 to BL31). A single group is accessed at a given time in read mode. It is the bit line decoder SELY associated with a gate circuit 6 that provides for the selection of this group.

In this structure, one control transistor TC per group and per word line has been associated to control the gate of the floating-gate transistor. Thus, for the word line WLi, there are the control transistors Tc0 to TC3, each respectively associated with a group G0 to G3.

All the control transistors of the first group are connected to one and the same control line CGT0. All the control transistors of the second group are connected to one and the same control line CGT1. The control lines CGT2 and CGT3 are each respectively associated with the group G2 and the group G3.

In an improved embodiment of the present invention, there is then provided an output buffer (40 to 43) for each group (G0 to G3) to apply the reference voltage Vout given by the generator according to the invention, to the control line of the associated group. In this example, the designator $SV_{READ}$ is used to denote the voltage reference generators of FIGS. 1 or 2. However, it is also possible to directly apply the voltage Vout to all the control lines at the same time, without the output buffers 40 to 43. The use of output buffers is warranted when the capacitance seen from the reference generator is excessively great.

Although embodiments of the present invention have been described with reference to an application to E²PROM memories, this is not its only application. They can be used more particularly as reference generators to charge capacitive lines.

Having thus described at least one illustrative embodiment of the invention, various alterations, modifications and improvements will readily occur to those skilled in the art. Such alterations, modifications and improvements are intended to be within the spirit and scope of the invention. Accordingly, the foregoing description is by way of example only and is not intended as limiting. The invention is limited only as defined in the following claims and the equivalents thereto.

What is claimed is:

1. A voltage reference generator comprising:
    a differential amplifier having positive and negative inputs and an output;
    a voltage source to supply a stable reference voltage to the positive input of the differential amplifier, the differential amplifier being configured as a follower with the output of the differential amplifier looped back to the negative input to form a negative feedback loop;
    wherein the negative feedback loop is a variable-resistance negative feedback loop controlled by the output of the differential amplifier in order to impose, transiently, an open-loop operation when the voltage source is turned on in such a way as to provide high current at the output of the differential amplifier before imposing a closed-loop operation in follower mode.

2. The voltage reference generator of claim 1, wherein a variable resistor is series-connected between the output and the negative input of the differential amplifier and a resistor with a determined resistance is connected between the negative input and ground.

3. The reference generator of claim 2, wherein the variable resistor is a transistor.

4. The reference generator of claim 1, wherein the voltage source includes a diode-mounted P type transistor.

5. An integrated circuit comprising:
    a voltage reference generator that includes a differential amplifier and a voltage source, the differential amplifier having positive and negative inputs and an output and the voltage source supplying a stable reference voltage to the positive input of the differential amplifier, the differential amplifier being configured as a follower with the output of the differential amplifier looped back to the negative input to form a negative feedback loop;
    wherein the negative feedback loop is a variable-resistance negative feedback loop controlled by the output of the differential amplifier in order to impose, transiently, an open-loop operation when the voltage source is turned on in such a way as to provide high current at the output of the differential amplifier before imposing a closed-loop operation in follower mode; and
    wherein the voltage reference generator has a control input to receive a control signal that enables the voltage reference generator to provide a generated output voltage on demand in response to an assertion of the control signal.

6. The integrated circuit of claim 5, wherein the output of the differential amplifier is coupled to at least one parallel-connected output buffer, each of the at least one parallel-connected output buffers providing the generated output voltage to a respective charging element.

7. The integrated circuit of claim 5, wherein the integrated circuit includes a memory circuit having a plurality of memory cells, and wherein the reference voltage generator provides the generated output voltage to the plurality of memory cells.

8. The integrated circuit of claim 5, wherein the integrated circuit includes a memory circuit having a plurality of memory cells, the plurality of memory cells being organized into several groups of memory cells, and wherein the output of said differential amplifier is coupled to several parallel-connected output buffers, a respective output of each of the several parallel-connected output buffers providing the generated output voltage to a respective one of the several groups of memory cells.

9. The integrated circuit of claim 7, wherein the memory circuit is an EEPROM memory circuit.

10. The integrated circuit of claim 8, wherein the memory circuit is an EEPROM memory circuit.

11. A method of generating an output voltage, comprising the steps of:
    generating a stable reference voltage; and
    responsive to an assertion of a first signal:
        supplying a first amount of output current to a capacitive line to rapidly charge a voltage level of the capacitive line to a voltage level of the stable reference voltage in response to the step of generating;
        reducing the first amount of output current supplied to the capacitive line as the voltage level of the capacitive line increases; and
        outputting a second amount of current to maintain the voltage level of the capacitive line at the voltage level of the stable reference voltage.

12. The method of claim 11, wherein the step of reducing the first amount of output current includes a step of decreasing a resistance of a negative feedback loop of a differential amplifier.

13. The method of claim 12, wherein the step of decreasing the resistance of the negative feedback loop of the differential amplifier includes a step of increasing a conductance of a transistor that is connected in series in the negative feedback loop.

14. The method of claim 11, wherein the step of reducing the first amount of output current includes a step of increasing a conductance of a transistor that is connected in series in a negative feedback loop of a differential amplifier.

15. The method of claim 11, wherein:
the step of generating the stable reference voltage is performed in response to an assertion of a second signal; and
the steps of supplying, reducing, and outputting are performed in response to the assertion of the first signal and the assertion of the second signal.

16. The method of claim 15, further comprising a step of discharging the capacitive line in response to the deassertion of the first signal or the second signal.

17. The method of claim 15, wherein the steps of supplying, reducing, and outputting are performed by a differential amplifier, and wherein the step of supplying includes:
switching, in response to the assertion of the first signal, a first transistor to connect a first supply terminal of the differential amplifier to a first supply voltage; and
switching, in response to a deassertion of an inverse of the first signal, a second transistor to connect a second supply terminal of the differential amplifier to a second supply voltage.

18. The method of claim 15, wherein the steps of the steps of supplying, reducing, and outputting are performed within approximately 200 nanoseconds of the assertion of the first signal.

19. A voltage reference generator, comprising:
a voltage source having an output to supply a steady reference voltage;
a differential amplifier having positive and negative inputs and an output, the positive input being coupled to the output of the voltage source; and
a variable-resistance negative feedback loop, coupled between the output of the differential amplifier and the negative input of the differential amplifier, to provide approximately open loop gain in a first state and approximately unity gain in a second state based upon a voltage level of the output of the differential amplifier.

20. The voltage reference generator of claim 19, further comprising:
a resistor coupled between the negative input of the differential amplifier and a first reference potential terminal.

21. The voltage reference generator of claim 20, wherein the variable-resistance negative feedback loop includes a transistor having a first terminal that is coupled to the output of the differential amplifier, a second terminal that is coupled to the negative input of the differential amplifier, and a control terminal that is coupled to a second reference potential terminal.

22. The voltage reference generator of claim 21, wherein the voltage source includes:
a second transistor having a first terminal that is coupled to the second reference potential terminal, a second terminal, and a control terminal;
a second resistor coupled between the second terminal of the second transistor and the output of the voltage source; and
a third transistor having a first terminal that is coupled to the output of the voltage source, a second terminal that is coupled to the first reference potential terminal, and a control terminal that is connected to the second terminal of third transistor;
wherein the voltage source supplies the steady reference voltage in response to a signal received at the control terminal of the second transistor.

23. The voltage reference generator of claim 21, further comprising:
a second transistor having a first terminal that is coupled to a first supply terminal of the differential amplifier, a second terminal that is coupled to the first reference potential terminal, and a control terminal that receives a first signal; and
a third transistor having a first terminal that is coupled to the second reference potential terminal, a second terminal that is coupled to a second supply terminal of the differential amplifier, and a control terminal that receives an inverse of the first signal;
wherein the second transistor couples the first supply terminal to the first reference potential terminal and the third transistor couples the second supply terminal to the second reference potential terminal when the first signal is asserted.

24. The voltage reference generator of claim 21, further comprising:
a first switch having a first terminal that is coupled to a first supply terminal of the differential amplifier and a second terminal that is coupled to the first reference potential terminal, the first switch coupling the first supply terminal to the first reference potential terminal when a first signal is asserted; and
a second switch having a first terminal that is coupled to the second reference potential terminal and a second terminal that is coupled to a second supply terminal of the differential amplifier, the second switch coupling the second supply terminal to the second reference potential terminal when the first signal is asserted.

25. The voltage reference generator of claim 24, further comprising:
a third switch having a first terminal that is coupled to the output of the differential amplifier and a second terminal that is coupled to the first reference potential terminal, the third switch coupling the output of the differential amplifier to the first reference potential terminal when the first signal is not asserted.

26. The voltage reference generator of claim 25, further comprising:
at least one output buffer coupled to the output of the differential amplifier, each of the at least one output buffers including second and third transistors each having first and second terminals and a control terminal, the first terminal of the second transistor being coupled to the second reference potential terminal, the second terminal of the second transistor being coupled to the first terminal of the third transistor, the second terminal of the third transistor being coupled to the first reference potential terminal, and the control terminals of the second and third transistors being coupled to the output of the differential amplifier.

27. The voltage reference generator of claim 26, further comprising:
a fourth switch having a first terminal that is coupled to the second terminal of the second transistor of each of the at least one output buffers and a second terminal that is coupled to the first reference potential terminal, the fourth switch coupling the second terminal of the second transistor of each of the at least one output buffers to the first reference potential terminal when the first signal is not asserted.

28. The voltage reference generator of claim 19, wherein the variable-resistance negative feedback loop includes a transistor having a first terminal that is coupled to the output of the differential amplifier, a second terminal that is coupled to the negative input of the differential amplifier, and a control terminal that is coupled to a second reference potential terminal.

29. The voltage reference generator of claim 19, further comprising:

at least one output buffer coupled to the output of the differential amplifier, each of the at least one output buffers including first and second transistors each having first and second terminals and a control terminal, the first terminal of the first transistor being coupled to a first reference potential terminal, the second terminal of the first transistor being coupled to the first terminal of the second transistor, the second terminal of the second transistor being coupled to a second reference potential terminal, and the control terminals of the second and third transistors being coupled to the output of the differential amplifier.

30. A voltage reference generator, comprising:

a voltage source having an output to supply a steady reference voltage;

a differential amplifier having positive and negative inputs and an output, the positive input being coupled to the output of the voltage source; and negative feedback means, coupled between the output of the differential amplifier and the negative input of the differential amplifier, for varying a gain of the differential amplifier from an approximately open loop gain to an approximately unity gain based on a voltage level of the output of the differential amplifier.

31. The voltage reference generator of claim 30, wherein the negative feedback means includes means for adjusting a resistance of the negative feedback means from an approximately infinite resistance to a negligible resistance to vary the gain of the differential amplifier.

32. The voltage reference generator of claim 30, further comprising:

a resistor coupled between the negative input of the differential amplifier and a first reference potential terminal; and wherein the negative feedback means includes means for adjusting a resistance of the negative feedback means to vary the gain of the differential amplifier.

33. The voltage reference generator of claim 30, further comprising:

first and second switching means for respectively coupling first and second supply terminals of the differential amplifier to respective supply voltages when a first signal is asserted.

34. The voltage reference generator of claim 33, wherein the output of the differential amplifier is coupled to a capacitive line, and the voltage reference generator further includes:

third switching means, coupled to the output of the differential amplifier and the capacitive line, for discharging the capacitive line when the first signal is not asserted.

35. The voltage reference generator of claim 34, further comprising:

buffering means, coupled between the output of the differential amplifier and the capacitive line, for reducing a capacitance of the capacitive line seen by the output of the differential amplifier.

36. The method of claim 11, wherein the step of reducing the first amount of output current includes a step of decreasing a resistance of a negative feedback loop of a differential amplifier from an approximately infinite resistance to a negligible resistance.

* * * * *

UNITED STATES PATENT AND TRADEMARK OFFICE
CERTIFICATE OF CORRECTION

PATENT NO. : 5,859,526
DATED : January 12, 1999
INVENTOR(S): Tien-Dung Do and Mathieu Lisart It is certified that error appears in the above-identified patent and that said Letters Patent is hereby corrected as shown below:

On the title page, Item [75] should read:

Tien-Dung Do, Fuveau, France and Mathieu Lisart, Aix En Provence, France.

Signed and Sealed this

Eleventh Day of May, 1999

*Attest:*

Q. TODD DICKINSON

*Attesting Officer*      *Acting Commissioner of Patents and Trademarks*